(12) United States Patent
Romano et al.

(10) Patent No.: US 7,505,490 B2
(45) Date of Patent: Mar. 17, 2009

(54) PHASE-CONTROL IN AN EXTERNAL-CAVITY TUNEABLE LASER

(75) Inventors: Andrea Romano, Milan (IT); Marco De Donno, Milan (IT); Aurelio Pianciola, Milan (IT)

(73) Assignees: PGT Phontonics S.p.A., Milan (IT); Telecom Italia S.p.A., Milan (IT)

( * ) Notice: Subject to any disclaimer, the term of this patent is extended or adjusted under 35 U.S.C. 154(b) by 0 days.

(21) Appl. No.: 10/573,892

(22) PCT Filed: Sep. 30, 2003

(86) PCT No.: PCT/EP03/10856

§ 371 (c)(1),
(2), (4) Date: Jan. 12, 2007

(87) PCT Pub. No.: WO2005/041371

PCT Pub. Date: May 6, 2005

(65) Prior Publication Data

US 2007/0211772 A1   Sep. 13, 2007

(51) Int. Cl.
*H01S 3/10* (2006.01)
(52) U.S. Cl. .................................. 372/20
(58) Field of Classification Search .................. 372/20
See application file for complete search history.

(56) References Cited

U.S. PATENT DOCUMENTS

| | | | |
|---|---|---|---|
| 6,205,159 B1 | 3/2001 | Sesko et al. | |
| 6,215,928 B1 | 4/2001 | Friesem et al. | |
| 6,366,592 B1 | 4/2002 | Flanders | |
| 6,526,071 B1 * | 2/2003 | Zorabedian et al. | 372/20 |
| 6,717,965 B2 | 4/2004 | Hopkins, II et al. | |

(Continued)

FOREIGN PATENT DOCUMENTS

GB    2 357 589    6/2001

OTHER PUBLICATIONS

Patel et al., "Frequency Locking of a Tunable Liquid-Crystal Filter", Journal of Applied Physics, vol. 71, No. 5, pp. 2464-2466, (1992).

*Primary Examiner*—Minsun Harvey
*Assistant Examiner*—Patrick Stafford
(74) *Attorney, Agent, or Firm*—Finnegan, Henderson, Farabow, Garrett & Dunner, L.L.P.

(57) ABSTRACT

A single-mode external-cavity tuneable laser includes a gain medium, a tuneable element and a channel allocation grid element. The channel allocation grid element is preferably an FP etalon which is structured and configured to define a plurality of equally spaced transmission peaks corresponding to the ITU channel grid, e.g., 200, 100, 50 or 25 GHz. The tuneable element, preferably a tuneable mirror, serves as the coarse tuning element that discriminates between the peaks of the grid etalon. The tuneable laser of the invention has a relatively short cavity length of not more than 15 mm, preferably not larger than 12 mm. It has been found that the FP etalon introduces a phase non-linearity in the external cavity, which induces a compression of the cavity modes, i.e., a reduction in the cavity mode spacing, in correspondence to the etalon transmission peaks. Mode compression increases with the decrease of the FWHM bandwidth of the grid FP etalon, hereafter referred to as $(FWHM)_{FP}$. $(FWHM)_{FP}$ should be about 2 GHz to about 8 GHz. Preferably, $(FWHM)_{FP}$ is approximately 3 to 6 GHz.

23 Claims, 12 Drawing Sheets

U.S. PATENT DOCUMENTS

| | | | |
|---|---|---|---|
| 2002/0054614 A1* | 5/2002 | Jin | 372/20 |
| 2003/0007522 A1 | 1/2003 | Li et al. | |
| 2003/0007526 A1 | 1/2003 | Pontis et al. | |
| 2003/0012239 A1 | 1/2003 | Daiber et al. | |
| 2003/0142702 A1 | 7/2003 | Pontis et al. | |

* cited by examiner

PHASE-CONTROL IN AN EXTERNAL-CAVITY TUNEABLE LASER

CROSS REFERENCE TO RELATED APPLICATION

This application is a national phase application based on PCT/EP2003/010856, filed Sep. 30, 2003, the content of which is incorporated herein by reference.

The invention concerns an external-cavity tuneable laser as optical transceiver, which is especially adapted for wavelength-division multiplexed optical communication networks.

RELATED ART

The use of lasers as tuneable light source can greatly improve the reconfigurability of wavelength-division multiplexed (WDM) systems or of the newly evolved dense WDM (DWDM) systems. For example, different channels can be assigned to a node by simply tuning the wavelength. Also, tuneable lasers can be used to form virtual private networks based on wavelength routing, i.e., photonic networks.

Different approaches can be used to provide tuneable lasers, such as distributed Bragg reflector lasers, VCSEL lasers with a mobile top mirror, or external-cavity diode lasers. External-cavity tuneable lasers offer several advantages, such as high output power, wide tuning range, good side mode suppression and narrow linewidth. Various laser tuning mechanisms have been developed to provide external-cavity wavelength selection, such as mechanically adjustable or electrically activated intracavity selector elements.

U.S. Pat. No. 6,526,071 describes an external-cavity tuneable laser that can be utilised in telecom applications to generate the centre wavelengths for any channel on the International Telecommunications Union (ITU) grid. The disclosed tuneable laser includes a gain medium, a grid generator and a channel selector, both grid generator and channel selector being located in the optical path of the beam. The grid generator selects periodic longitudinal modes of the cavity at intervals corresponding to the channel spacing and rejects neighbouring modes. The channel selector selects a channel within the wavelength grid and rejects other channels.

In order to accommodate increasing optical communication traffic, DWDM systems with channel spacing of 50 GHz and eventually of 25 GHz are under development. As DWDM uses narrower channel spacing, wavelength (frequency) accuracy of transmitter lasers over the entire tuning and operating temperature range has become an important issue. DWDM systems with 50 GHz channel spacing typically require an accuracy of ±2.5 GHz about the lasing frequency, whereas systems with 25 GHz generally require a frequency accuracy of ±1.25 GHz. A reliable wavelength stabilisation scheme to rapidly and correctly set and keep the desired operating wavelength is therefore a crucial issue in assembly and operation of tuneable lasers.

Active control systems of the laser wavelength and of other output parameters are generally implemented in external-cavity tuneable laser systems. Often, these active control systems rely on locking the laser wavelength to the desired operating wavelength. Common locking techniques can use a feedback signal to maintain the wavelength centred to the desired value, either through current or temperature feedback. Wavelength locking systems can be present as external support circuitry or be integrated in the laser module.

U.S. Pat. No. 6,366,592 describes a tuneable laser including a tuneable Fabry-Perot (FP) cavity and a cavity length modulator, which controls the optical length of the cavity. The FP cavity is first tuned to the desired wavelength of operation, then the cavity length modulator is driven to vary the physical length of the laser cavity by an amount that is typically less than one wavelength of light at the operational wavelength. Fine intercavity mode tuning is achieved by reference to the absolute wavelength as detected by a wavelength locker. Alternatively, the cavity length is adjusted until the output power is maximised, which will occur when the cavity mode is centred at the centre wavelength of the FP filter. The solution described in the patent is said to be mostly applicable to tuneable laser having short laser cavities, preferably less than 3 cm, in a preferred embodiment less than 1 cm.

Inventors have noted that discrete wavelength selection of an intracavity element which is continuously tuneable can limit the accuracy of wavelength tuning and makes the use of a wavelength locking system necessary to maintain the wavelength to the desired operating value. They have further remarked that the use of a wavelength locking system, also if integrated, increases the cost of the laser module and may be prejudicial to the compactness of the laser system.

U.S. patent application No. 2003/0012230 describes an external-cavity laser including a grid etalon and a wedge etalon channel selector positioned in the optical path between a gain medium and an end mirror. The grid etalon has a free spectral range (FSR) which corresponds to the spacing between the grid lines of the ITU grid. The full width half maximum (FWHM) of the linewidth of the channel selector is said to be greater than 1.0 nm, corresponding to about 120 GHz, and less than 1.5 nm, corresponding to about 190 GHz. In a specific example, the grid generator has a FWHM linewidth of about 0.2 nm, corresponding to about 25 GHz.

Applicants have noted that centring of the cavity mode to a selected peak the grid generator (i.e., the selected channel) in order to suppress neighbouring modes of the external cavity laser between each channel of the wavelength grid is particularly difficult when the grid generator has a low finesse relative to the cavity mode spacing. In this case, a feedback system that actively controls and locks the resonant wavelength to the selected channel is generally required.

A number of liquid crystal (LC) devices have been developed as electronically tuneable spectral filters for wavelength selection in lasers and related WDM system components.

LC filters are often driven by an alternating current (AC) voltage to prevent degradation of the liquid crystal because of electrochemical effects. In "*Frequency locking of a tuneable liquid-crystal filter*", published in Journal of Applied Physics, vol. 71, pages 2464-66, a technique for frequency locking of a tuneable LC Fabry-Perot (FP) filter is described. The AC voltage at frequency $\omega$, which is applied to the LC-FP filter to control the resonance of the filter, causes a small modulation at $2\omega$ in the transmitted light intensity. To compensate for temperature fluctuations, frequency tracking of the FP filter is performed by a feedback system that minimises the derivative signal resulting from the $2\omega$ signal.

Wavelength selection and tuning of a laser cavity can be performed by using an active tuneable mirror. An electro-optically controlled element employing LC and which can be used as an active tuneable mirror is disclosed in U.S. Pat. No. 6,215,928. The lasing wavelength of the laser is determined by the active tuneable mirror to be the resonance wavelength of the mirror. The resonant wavelength may be shifted by varying the voltage or current supplied to the electro-optically controlled element.

U.S. Pat. No. 6,205,159 discloses an external-cavity semiconductor laser that tunes to a discrete set of wavelengths by changing the voltage to a LC-FP interferometer. The discrete set of wavelengths one may tune to is defined by a static intracavity etalon. The static intracavity etalon's FSR is designed so that it is greater than the resolution bandwidth of the LC FP interferometer. The FWHM linewidth of the static etalon must be less than the external cavity longitudinal mode spacing. For an external cavity optical path length of 25 mm, a solid etalon with a FSR of 100 GHz and a FWHM of 3.3 GHz is said to meet the requirement for stable operation.

SUMMARY OF THE INVENTION

The present invention relates to a single-mode external-cavity tuneable laser including a gain medium, a tuneable element and a channel allocation grid element. The channel allocation grid element is preferably a FP etalon, which is structured and configured to define a plurality of equally spaced transmission peaks. In applications for WDM or DWDM telecommunication systems, transmission peak spacing, i.e., the FSR of the grid element, corresponds to the ITU channel grid, e.g., 200, 100, 50 or 25 GHz. The FP etalon includes a pair of partially reflective mirrors facing one another and separated by an optical path. The FP etalon can be a solid or an air-spaced etalon. The tuneable element, preferably a tuneable mirror, serves as the coarse tuning element that discriminates between the peaks of the grid etalon. The FWHM bandwidth of the tuneable element is not smaller than the FWHM bandwidth of the grid etalon. For longitudinal single-mode operation, the transmission peak of the FP etalon corresponding to a particular channel frequency should select, i.e., transmit, a single cavity mode. Therefore, the FP etalon should have a finesse, which is defined as the FSR divided by the FWHM, which suppresses the neighbouring modes of the cavity between each channel. For single-mode laser emission, a longitudinal cavity mode should be positioned over the maximum of one of the etalon transmission peaks (the one selected by the tuneable element). In this way, only the specified frequency will pass through the etalon and the other competing neighbouring cavity modes will be suppressed. The tuneable laser of the invention has a relatively short cavity length, i.e., not more than about 15 mm. A short laser cavity is desired for size constraints when the laser system is assembled in a standard package, e.g., a butterfly package. Furthermore, as it will become clear from the following discussion, a short cavity exhibits a better mode suppression of the modes transmitted through the etalon than a longer cavity. The suppression of the cavity modes neighbouring to the lasing mode by the etalon will be hereafter referred to as the spectral etalon side suppression (ESS). Preferably, the cavity length is not larger than about 12 mm.

Decreasing the laser cavity length yields to an increase of the spacing of the longitudinal cavity modes, i.e., the free spectral range of the laser cavity, hereafter referred to as $(FSR)_{cavity}$, owing to the relation $$(FSR)_{cavity} = \frac{c_0}{2\sum_i n_i L_i} \quad (1)$$

wherein $c_0$ is the speed of light in vacuo, $n_i$ (i=1, ... ,m) is the refractive index of the medium filling the $i^{th}$—optical element that the light encounters in the cavity and of the cavity itself (i.e., the free space) and $L_i$ is the physical length of light travel of the of the $i^{th}$ element. The optical path of the light in the laser cavity is referred to as the effective cavity length, $L_{eff}$, which is defined as $$L_{eff} = \sum_i n_i L_i. \quad (2)$$

The effective cavity length is of course related to the physical length of the external cavity, $L_0$. The laser external cavity can be thought of as an optical resonator composed of two confronting and reflective, generally parallel, surfaces separated by a length, which is defined as the physical length of the cavity, $L_0$. In general, $L_{eff} \geq L_0$.

It is possible to re-write Eq. (1) as $$(FSR)_{cavity} = \frac{c_0}{2L_{eff}} \quad (3)$$

For external-cavity lasers having $L_0$ smaller than 15 mm, $(FSR)_{cavity}$ is typically larger than about 8-10 GHz.

When a shorter cavity is used, a lower finesse FP etalon could in principle be employed. The ability of using a lower finesse FP etalon would relax alignment tolerances, thereby reducing complexity of the device.

Inventors have found that the FP etalon introduces a phase non-linearity in the external cavity, which induces a compression of the cavity modes, i.e., a reduction in the cavity mode spacing, in correspondence to the etalon transmission peaks. Mode compression increases with the decrease of the FWHM bandwidth of the grid FP etalon, hereafter referred to as $(FWHM)_{FP}$. For a large enough value of $(FWHM)_{FP}$, the value depending on the cavity length, cavity mode compression becomes negligible. To a first approximation, the effect of mode compression is significant, i.e., larger than about 10%, for $(FWHM)_{FP}$ lower than $2.5(FSR)_{cavity}$.

Although mode compression is particularly significant for very narrow bandwidth resolutions of the FP etalon, other considerations set in practice a lower limit in the $(FWHM)_{FP}$. The FP etalon introduces optical losses in the laser cavity, which increase with decreasing $(FWHM)_{FP}$. Inventors have observed that $(FWHM)_{FP}$ should be not smaller than about 2 GHz in order to restrain optical losses.

Inventors have found that $(FWHM)_{FP}$ should be comprised in the range from about 2 GHz to about 8 GHz. Preferably, $(FWHM)_{FP}$ is comprised between approximately 3 and 6 GHz. Channel spacing, $(FSR)_{FP}$, is preferably comprised between 25 and 200 GHz.

The effect of cavity mode compression within etalon modes can be used to control the phase of the laser cavity. The inventors have determined that, for a given cavity length, thus for a given "intrinsic" (i.e., without taking into account the etalon non-linearity) cavity mode spacing, $(FSR)_{cavity}$, the $(FWHM)_{FP}$ can be selected such that there is at least a cavity mode within one etalon peak, which is positioned by not more than a certain distance from the centre of the etalon mode (i.e., the peak value). In other words, for any channel that has been selected by the tuneable element, the laser emission wavelength can be defined within a certain wavelength range about the peak wavelength of the selected etalon peak. A laser system satisfying this condition will exhibit a passive phase "quasi-synchronism" that is achieved by the geometry of the laser cavity and does not require an active control.

FIG. 1 is a diagram illustrating the various modes within the laser cavity: in (A) the cavity modes induced by the resonant external cavity, i.e., $(FSR)_{cavity}$; in (B) the modes of the FP etalon having the positions of the peaks locked to a standard ITU channel spacing (in the shown example (FSR)$_{FP}$ is of 100 GHz); and (C) is the pass band of the tuneable element, i.e., the channel selector.

For a given "intrinsic" cavity mode spacing, (FSR)$_{cavity}$, the cavity mode spacing within the etalon transmission peaks, including the effect of the etalon non linearity, varies from a minimum mode spacing, s$_{min}$, to a maximum mode spacing, s$_{max}$. With reference to FIG. 2(a), s$_{min}$ corresponds to the condition wherein there are at least two cavity modes within an etalon transmission peak and the two modes that are adjacent to frequency f$_{FP}$ corresponding to the maximum of the (selected) etalon peak are substantially equidistant from said frequency f$_{FP}$. In this condition, there is no dominant frequency sufficient to provide the necessary coherence length, and longitudinal mode hopping may occur. Under mode hopping condition, the mode jumps between longitudinal cavity modes resulting in a sudden, discontinuous change in the laser output wavelength and power. The positions of the cavity modes outside and within the etalon peak are illustrated in FIG. 2(a) with open squares.

With reference to FIG. 2(b), s$_{max}$ provides the condition where the frequency of one cavity mode substantially overlaps f$_{FP}$, corresponding to the optimal single-mode laser operation, i.e., stable lasing with (full) phase synchronism.

Inventors have observed that advantageous filtering characteristics of the grid etalon are related to the desired frequency (wavelength) accuracy one wants to obtain in the tuneable laser system. They have found that, for a given frequency accuracy, ±Δv, (FWHM)$_{FP}$ should be selected such that the following relation is satisfied:

$$s_{min} \leq 2\Delta v \quad (4)$$

When the condition expressed by Eq. (4) is satisfied, phase quasi-synchronism of the laser cavity is attained.

Understanding the phase quasi-synchronism condition allows flexibility in the laser design, which can be for example tailored to the different customer requirements. According to the present invention, frequency accuracies in the laser output frequency down to about 0.5 GHz are achievable.

Inventors have noted a fairly weak dependence of the s$_{min}$ on the resolution bandwidth of the tuneable element, i.e., the channel selector. Variations within 0.1-0.2 GHz in the (FWHM)$_{FP}$ have been found for FWHM of the tuneable element ranging from about 50 to 200 GHz.

In one aspect, the invention relates to a tuneable laser system configured to emit output radiation on a single longitudinal mode at a laser emission frequency, the laser system including
- an external cavity having a physical length L$_0$ and a plurality of cavity modes;
- a gain medium to emit an optical beam into the external cavity;
- a channel allocation grid element being arranged in the external cavity to define a plurality of pass bands substantially aligned with corresponding channels of a selected wavelength grid, the pass bands having a bandwidth at full-width half maximum (FWHM);
- and a tuneable element being arranged in the external cavity to tuneably select one of the pass bands so as to select a channel to which to tune the optical beam,
- wherein L$_0$ is not larger than 15 mm and the bandwidth at FWHM of the channel allocation grid element is comprised between 2 and 8 GHz.

In another aspect, the invention relates to a method for controlling a laser emission frequency of a tuneable laser system having an external cavity defining a plurality of cavity modes spaced from each other by (FSR)$_{cavity}$, the laser emission frequency being selected on a single longitudinal cavity mode, said method comprising the steps of
- tuning an optical beam emitted from a gain medium to a corresponding centre frequency of a pass band selected from a plurality of pass bands substantially aligned with corresponding channels of a selected wavelength grid element,
- selecting the bandwidth at FWHM of the selected pass band so that FWHM<2.5(FSR)$_{cavity}$, and FHWM≧2 GHz.

In the preferred embodiments, the tuneable element is a tuneable mirror, which forms an end mirror of the external cavity and defines it in length together with the reflecting front facet of the gain medium, e.g., a semiconductor laser diode. FIG. 3 schematically depicts the external-cavity laser configuration comprising a tuneable mirror. Gain medium 1 comprises a front facet 2 and a back facet 3. Front facet 2 is partially reflecting and serves as one of the end mirrors of the external cavity. Back facet 3 has a low reflectivity. It is typically coated with an anti-reflection coating (not shown). A collimating lens 4 converges the optical beam emitted by the gain medium onto a FP etalon 5, which has the modes locked to the ITU channel grid. After the FP etalon 5, the beam impinges on a tuneable mirror 6, which forms the other end mirror of the external cavity and together with the gain medium front facet defines the cavity physical length, L$_0$. The tuneable mirror is tuned to the desired channel frequency by selecting one of the etalon transmission peaks. The tuneable mirror 6 is tuned electronically by varying the applied voltage supplied by a voltage generator 7.

For the laser effect to occur in the laser cavity, two conditions should be met: the condition for resonance and the condition for gain, which can be expressed, respectively, by the following equations $$2j\Phi_{LD} + 2j\Phi_{FS} + 2j\Phi_{FP} + j\Phi_{R2} = 2jN\pi \quad (5)$$

$$G_{LD}^2(\lambda) G_{FP}^2(\lambda) \cdot R_1 \cdot R_2(\lambda) = 1 \quad (6)$$

where N is an integer number, G$_{LD}$ is the spectral gain of the laser diode, φ$_{LD}$ is the phase delay introduced by the laser diode, φ$_{FP}$ is the phase delay introduced by the etalon, φ$_{FS}$ is the phase delay introduced by the free space, G$_{FP}$ is the transmission spectrum of the etalon, R$_1$ is the reflectivity of the front facet of the laser diode, R$_2$(λ) is the reflectivity of the tuneable mirror, and φ$_{R2}$ is the phase delay introduced by the tuneable mirror. The etalon phase delay φ$_{FP}$ is related to the reflectivity of the etalon mirrors. It is known that the sharpness of the transmission, represented by the finesse, increases with the reflectivity of the mirrors of the etalon. Thus, φ$_{FP}$ is related, through an appropriate function, to (FWHM)$_{FP}$.

Equations (5) and (6) can be combined to obtain the laser cavity modes $$G_{LD}^2(\lambda) e^{2j\Phi_{LD}} \cdot e^{2j\Phi_{FS}} \cdot G_{FP}^2(\lambda) \cdot e^{2j\Phi_{FP}} \cdot R_1 \cdot R_2(\lambda) \cdot e^{j\Phi_{R2}} = e^{2jN\pi} \quad (7)$$

Inventors have noted that the FP etalon introduces the predominant contribution to phase non-linearity in the laser cavity in comparison to the contributions introduced by the other elements present in the cavity and by the cavity itself. The tuneable element selects one of the etalon peaks. The phase non-linearity of the selected etalon peak can thus be considered as the non-linearity of the FP etalon combined with that of the tuneable element. As above mentioned, mode compression caused by the FP etalon exhibits a weak dependence on the resolution bandwidth of the tuneable element.

By means of Eq. (7) it is possible to derive the value, or range of values, of the etalon phase delay, and thus of (FWHM)$_{FP}$, for a desired value of s$_{min}$. The desired value of s$_{min}$ is related to the required or desired frequency accuracy of the tuneable laser.

Precise channel centring and long-term frequency stability can be attained by monitoring the laser output power and making small adjustments to one laser parameter, e.g., the injection current of the gain medium, until the power is maximised. As it will become clear from the following discussion, channel centring of the cavity mode is achievable by using only a simple maximisation of the output power thanks to the phase quasi-synchronism provided by the appropriate selection of the grid etalon optical transmission characteristics.

The laser system can be housed in a standard 14-pin butterfly package that may contain a temperature stability system. According to an embodiment of the invention, the gain medium is mounted on a first thermoelectric cooler (TEC)

According to another embodiment, the channel allocation grid element is mounted on a second TEC.

According to a further embodiment of the invention, the gain medium and the channel allocation grid, an optionally the tuneable mirror, are mounted on the same TEC.

One further advantage of the laser system of the invention is that it may include no moving parts to achieve tunability.

The laser system according to the present invention is designed especially to provide fast switching over the entire C-band on the ITU 50 GHz channel grid. With the active control system according to the present invention, no wavelength locker is needed to achieve frequency stability with 25 GHz DWDM channel spacing.

DETAILED DESCRIPTION

Figure 4A:
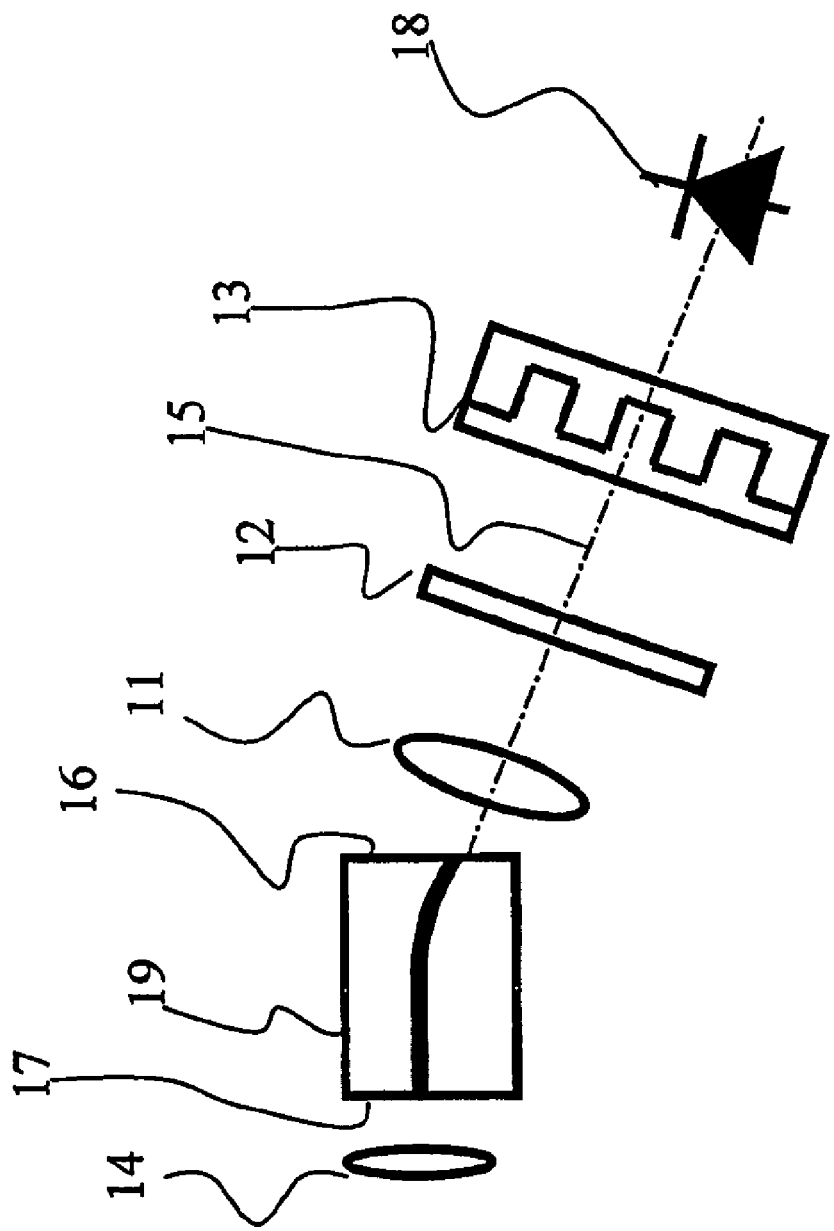
FIG. 4(a) is a schematic view of the tuneable laser assembly according to another embodiment of the invention.

A tuneable laser system according to a preferred embodiment of the present invention is schematically depicted in FIG. 4(a). The gain medium 19 is based on a semiconductor laser diode, for example an InGaAs/InP multiple quantum well FP gain chip especially designed for external-cavity laser applications. The diode comprises a front facet 17 and a back facet 16. The diode's back facet 16 is an intracavity facet and has an anti-reflection coating with a measured residual reflectance of the order of $10^{-4}/10^{-5}$. Preferably, the gain chip waveguide is bent so that it has an angled incidence on the back facet in order to further reduce back reflections. The front facet 17 is partially reflective and serves as one of the end mirrors of the external cavity. The reflectivity of the front facet is ranging between 5% and 30%. The emerging beam from the diode back facet is collimated by a collimating lens 11 that collimates the beam onto a Fabry-Perot etalon filter 12. In a preferred embodiment, the laser diode gain bandwidth is around 100 nm.

The laser can be designed in such a way that the operating wavelengths are aligned with the ITU channel grid. In this case, the laser wavelength is centred to the ITU grid via the FP etalon 12, which is structured and configured to define a plurality of transmission peaks. Transmission peak spacing, i.e., the free spectral range (FSR)$_{FP}$, which corresponds to the channel spacing, can be of e.g., 200 GHz, 100 GHz, 50 GHz or 25 GHz. The sharpness of the transmission peaks is represented by (FWHM)$_{FP}$, or by the finesse, which is the ratio of the etalon's FSR to the FWHM.

Preferably, the FP etalon is placed in the cavity with a slight inclination angle to the perpendicular to the optical beam 15 in order to keep the reflected light of the FP etalon from returning to the laser diode. The inclination angle of the FP etalon is preferably comprised between 0.4° and 0.8°, more preferably of about 0.5°.

After the FP etalon 12, the beam strikes a tuneable mirror 13, which together with the first end mirror defines the cavity physical length, L$_0$. The tuneable mirror 13 reflects the light signal back to the gain medium, resulting in a resonant behaviour in the cavity between the tuneable mirror and the front facet 17 of the gain medium. In other words, the optical path from the back facet of the gain medium to the tuneable mirror forms a resonator that has a (FSR)$_{cavity}$ that depends inversely on the effective cavity length, L$_{eff}$, of the external cavity [Eq. (3)]. The laser beam is coupled out of the external cavity by the partially reflective front facet 17 of the gain medium. Optionally, a collimating lens 14 can be placed along the optical path of the laser output beam.

The laser assembly is designed to produce substantially single longitudinal and, preferably, transversal mode radiation. Longitudinal modes refer to the simultaneous lasing at several discrete frequencies within the laser cavity. Transversal modes correspond to the spatial variation in the beam intensity cross section in the transverse direction of the lasing radiation. Generally, an appropriate choice of the gain medium, e.g., a commercially available semiconductor laser diode including a waveguide, guarantees single spatial, or transversal, mode operation.

The laser is configured to emit an output radiation at a selected one of a plurality of equally spaced output frequencies that match the equally spaced channel frequencies in a WDM or DWDM system. The laser is operative to emit a single longitudinal mode output at wavelength $\lambda_{CM}$ (CM=cavity mode), which depends on the spectral response of the optical elements within the cavity and on the phase of the cavity.

Figure 1:
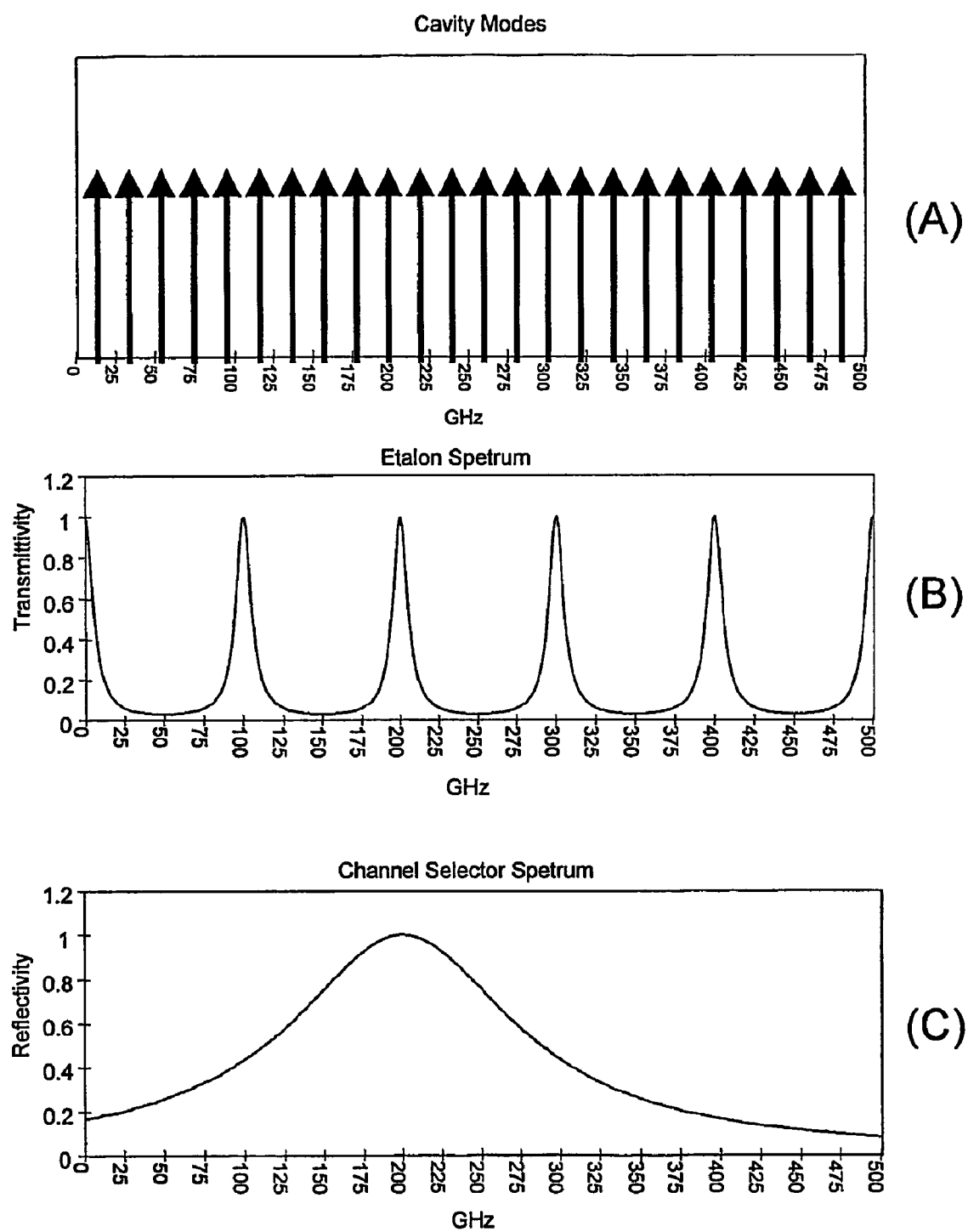
FIG. 1 is a graphical illustration of the external longitudinal cavity modes (A), of the transmission modes of the channel allocation grid (B), and of the bandwidth of the channel selector, i.e., the tuneable element (C).
Figure 2A:
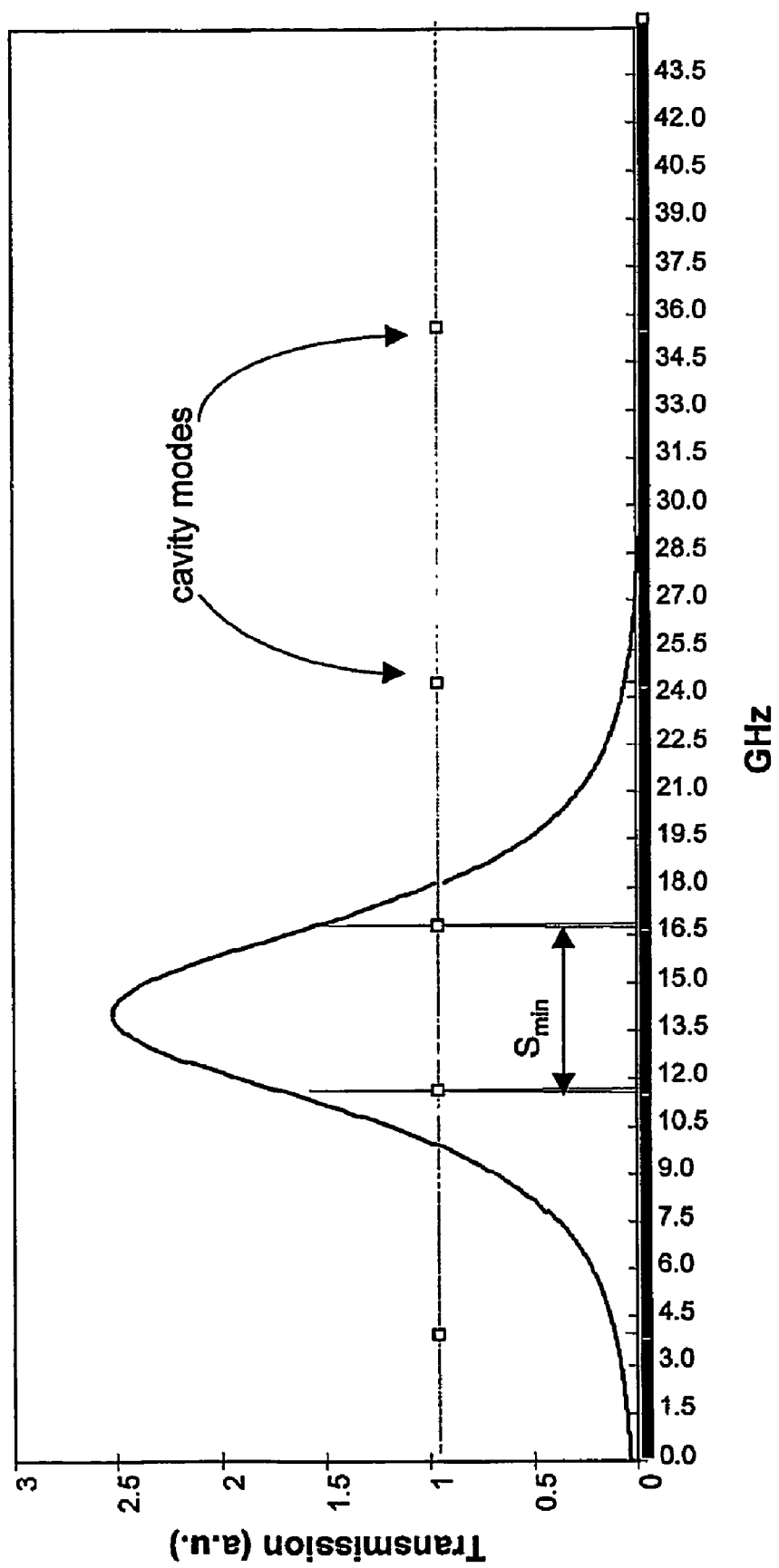
FIG. 2(a) is a graphical illustration of the longitudinal cavity modes within the pass band of the channel allocation grid selected by the tuneable element when the laser oscillating condition is on mode hopping.
Figure 2B:
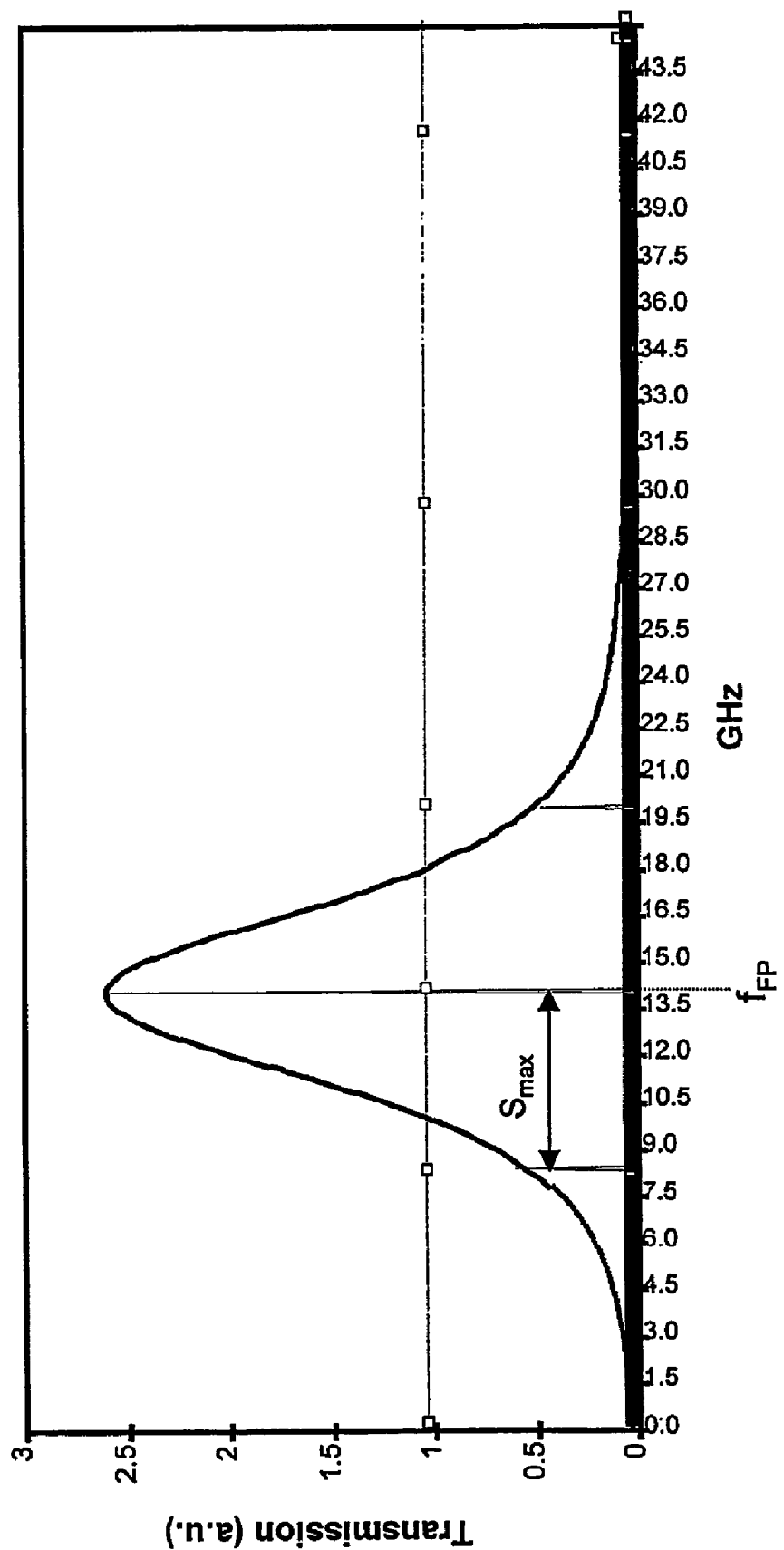
FIG. 2(b) is a graphical illustration of the longitudinal cavity modes within the pass band of the channel allocation grid selected by the tuneable element on phase synchronism condition.
Figure 3:
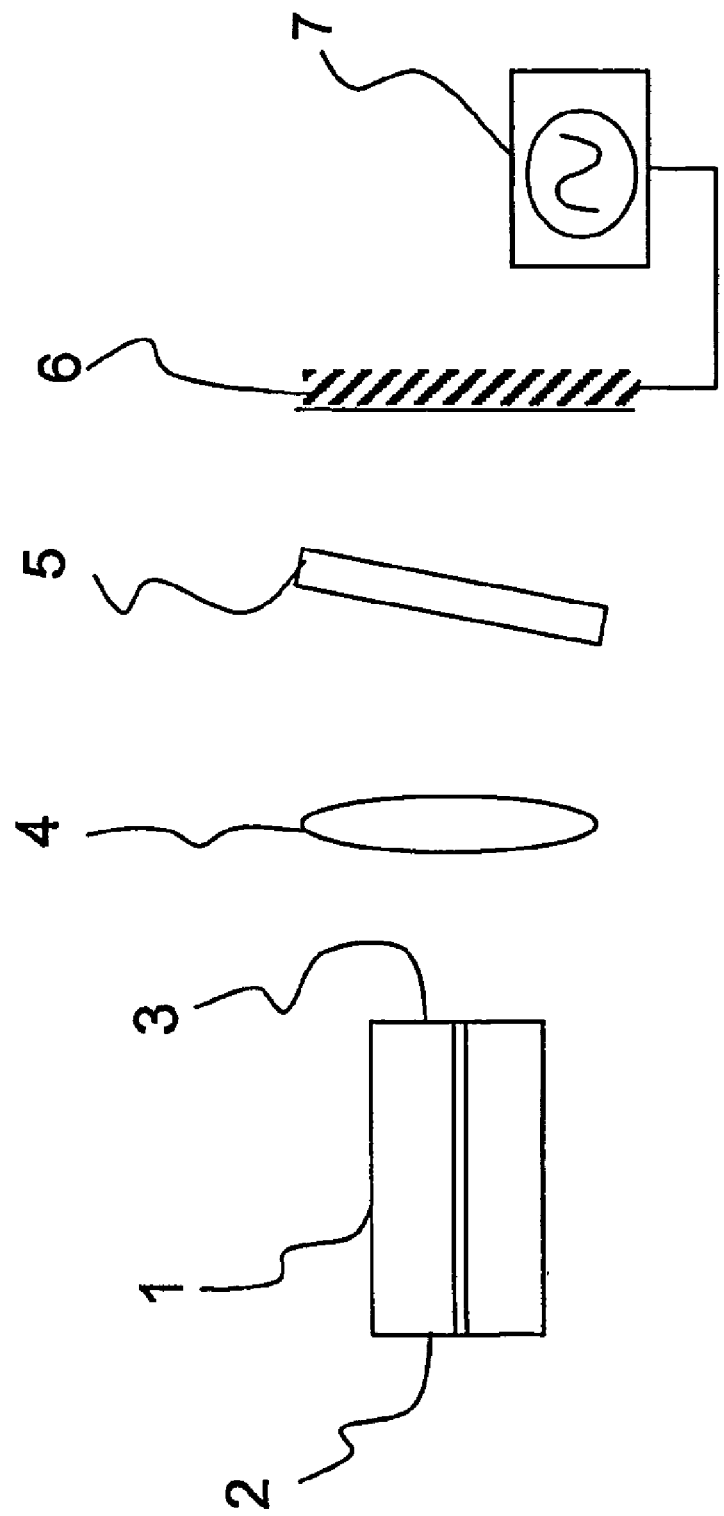
FIG. 3 is a block diagram of an external-cavity tuneable laser including a tuneable mirror, according to an embodiment of the invention.

The FP etalon introduces a phase delay in the laser cavity, which induces a compression of the cavity modes, i.e., a reduction in the cavity mode spacing, in correspondence to the etalon transmission peaks. Referring to FIG. 2(a), $(FWHM)_{FP}$ is selected so as to obtain the desired values of $s_{min}$ by taking into account the effect of cavity mode compression. The values of $s_{min}$ are related to the required frequency accuracy of the laser, $\Delta v$, through Eq. (4).

Tables I and II report various values of $s_{min}$, $s_{max}$ and etalon side suppression (ESS) for different values of $(FWHM)_{FP}$ for $(FSR)_{FP}$=100 GHz. Values were derived from numerical simulations of Eq. (7). Table I refers to a relatively long laser cavity, i.e., $L_0$=25 mm, and Table II refers to a relatively short laser cavity, i.e., $L_0$=12.5 mm. For both Table I and Table II, FWHM of the tuneable mirror, $(FWHM)_{TM}$, is of 100 GHz. Differences of 0.1-0.2 GHz in the values of $(FWHM)_{FP}$ were found for $(FWHM)_{TM}$ ranging from 50 to 200 GHz, indicating a weak dependence of $(FWHM)_{FP}$ on $(FWHM)_{TM}$ within the considered range.

TABLE I

| $L_0$ = 25 mm | $(FSR)_{cavity}$ = 5.3 GHz | | $(FSR)_{FP}$ = 100 GHz | |
|---|---|---|---|---|
| $(FWHM)_{FP}$ (GHz) | Finesse | $s_{min}$ (GHz) | $s_{max}$ (GHz) | ESS (dB) |
| 1.97 | 50.8 | 1.4 | 1.9 | 12.8 |
| 4.07 | 25.6 | 2.3 | 2.6 | 8.0 |
| 5.94 | 16.8 | 2.8 | 3.1 | 6.0 |
| 7.92 | 12.6 | 3.2 | 3.4 | 4.6 |
| 10.05 | 9.9 | 3.6 | 3.7 | 3.6 |

TABLE II

| $L_0$ = 12.5 mm | $(FSR)_{cavity}$ = 9.6 GHz | | $(FSR)_{FP}$ = 100 GHz | |
|---|---|---|---|---|
| $(FWHM)_{FP}$ (GHz) | Finesse | $s_{min}$ (GHz) | $s_{max}$ (GHz) | ESS (dB) |
| 1.97 | 50.8 | 1.6 | 2.8 | 19.8 |
| 4.07 | 25.6 | 2.9 | 3.9 | 13.8 |
| 5.94 | 16.8 | 3.7 | 4.7 | 10.9 |
| 7.92 | 12.6 | 4.5 | 5.3 | 8.9 |
| 10.05 | 9.9 | 5.2 | 5.9 | 7.4 |

As it is clear from Tables I and II, cavity mode compression increases with decreasing the value of $(FWHM)_{FP}$ and it is enhanced in case of shorter cavity lengths. For example, for $(FWHM)_{FP}$=4.07 GHz, minimum cavity mode spacing is reduced by about 57% in case of $L_0$=25 mm, whereas mode spacing reduction is of about 70% in case of $L_0$=12.5 mm. Furthermore, results reported in Tables I and II indicate that ESS is more pronounced in a shorter laser cavity, all other laser parameters being the same.

Therefore, relatively short cavity lengths have the advantage of having a relatively large ESS, i.e., the etalon has a better spectral selectivity in shorter laser cavities. Inventors have noted that cavity lengths not larger than about 15 mm allow a laser design in which the grid element has a good spectral selectivity.

Tables III and IV report values of $(FWHM)_{FP}$, finesse and $s_{min}$ for a cavity length $L_0$=12.5 mm and $(FSR)_{FP}$ of 50 and 25 GHz, respectively.

TABLE III

| $L_0$ = 12.5 mm $(FSR)_{FP}$ = 50 GHz | $(FSR)_{cavity}$ = 9.6 GHz | |
|---|---|---|
| $(FWHM)_{FP}$ (GHz) | Finesse | $s_{min}$ (GHz) |
| 1.97 | 25.4 | 1.8 |
| 4.07 | 12.3 | 3.0 |
| 5.94 | 8.42 | 4.0 |
| 7.92 | 6.3 | 4.8 |
| 10.05 | 5.0 | 5.5 |

TABLE IV

| $L_0$ = 12.5 mm $(FSR)_{FP}$ = 25 GHz | $(FSR)_{cavity}$ = 9.6 GHz | |
|---|---|---|
| $(FWHM)_{FP}$ (GHz) | Finesse | $s_{min}$ (GHz) |
| 1.97 | 12.7 | 1.8 |
| 4.07 | 6.1 | 3.3 |
| 5.94 | 4.2 | 4.5 |
| 7.92 | 3.2 | 5.5 |
| 10.05 | 2.5 | 6.2 |

Results indicate that a lower $(FSR)_{FP}$ requires a slightly more selective, i.e., with narrower transmission bandwidths, etalon if a relatively high frequency accuracy is to be achieved.

Table V reports values of $(FWHM)_{FP}$ and $s_{min}$ for different values of $(FSR)_{FP}$ for a laser cavity of cavity length $L_0$=10 mm.

TABLE V

| | $(FSR)_{cavity}$ = 12 GHz | | |
|---|---|---|---|
| | $(FSR)_{FP}$ = | | |
| $L_0$ = 10 mm | 25 GHz | 50 GHz | 100 GHz |
| $(FWHM)_{FP}$ (GHz) | $s_{min}$ (GHz) | $s_{min}$ (GHz) | $s_{min}$ (GHz) |
| 1.97 | 1.9 | 1.8 | 1.7 |
| 4.07 | 3.6 | 3.2 | 3.0 |
| 5.94 | 5.0 | 4.3 | 4.0 |
| 7.92 | 6.2 | 5.3 | 4.9 |
| 10.05 | 7.1 | 6.2 | 5.7 |

As an example of possible relationship between $(FWHM)_{FP}$ and $s_{min}$, inventors have inferred from the examples reported in Tables I to V an approximately linear dependence between $(FWHM)_{FP}$ and $s_{min}$, which can be expressed by the following relation:

$$(FWHM)_{FP} = \alpha + \beta \cdot s_{min}. \qquad (8)$$

For example, referring to data reported in Table V for $L_0$=10 mm and $(FSR)_{FP}$=100 GHz, $\alpha \cong -1.7$ GHz and $\beta \cong 2.0$. If the required $\Delta v$ is ±1.25 GHz and $s_{min} \approx 2\Delta v$ [from Eq. (4)], $(FWHM)_{FP} \approx 3.3$ GHz.

Referring back to the example reported in Table II, for $L_0$=12.5 mm, $(FSR)_{FP}$=100 GHz and $\Delta v$ is ±1.25 GHz, $(FWHM)_{FP} \approx 3.6$ GHz. Considering all the examples shown in Tables I to V, for a cavity length between 10 and 12.5 mm and a $(FSR)_{FP}$ ranging from 25 to 100 GHz, a frequency accuracy of ±1.25 GHz corresponds to a value of $(FWHM)_{FP}$ ranging from about 2.6 GHz to about 3.6 GHz.

The intercept on the $(FWHM)_{FP}$ axis and the slope depend on cavity length and on channel spacing, $\alpha=\alpha[(FSR)_{FP}, L_{eff}]$ and $\beta=\beta[(FSR)_{FP}, L_{eff}]$. For $L_0$ comprised between 7.5 and 15 mm and channel spacing comprised between 25 and 100 GHz, $\alpha$ ranges roughly from −0.8 to −2.7 GHz and $\beta$ ranges roughly from 1.2 to 2.6. Slope and intercept increase, in absolute value, with increasing channel spacing and with increasing $L_{eff}(L_0)$.

Inventors have found that, for an optical path length not larger than about 15 mm, phase quasi-synchronism is attained for values of $(FWHM)_{FP}$ not larger than about 8 GHz. Preferably, $(FWHM)_{FP}$ is not larger than 6 GHz.

The choice of the optimal $(FWHM)_{FP}$ should also take into account that optical losses in the laser cavity increase with the spectral selectivity of the etalon. In addition, with the decrease of the $(FWHM)_{FP}$, the optical power density in the etalon increases, leading to possible instabilities in the spectral response of the etalon caused by thermo-optical effects. These considerations set in practice a lower limit in the choice of the optimal value of $(FWHM)_{FP}$.

Figure 5:
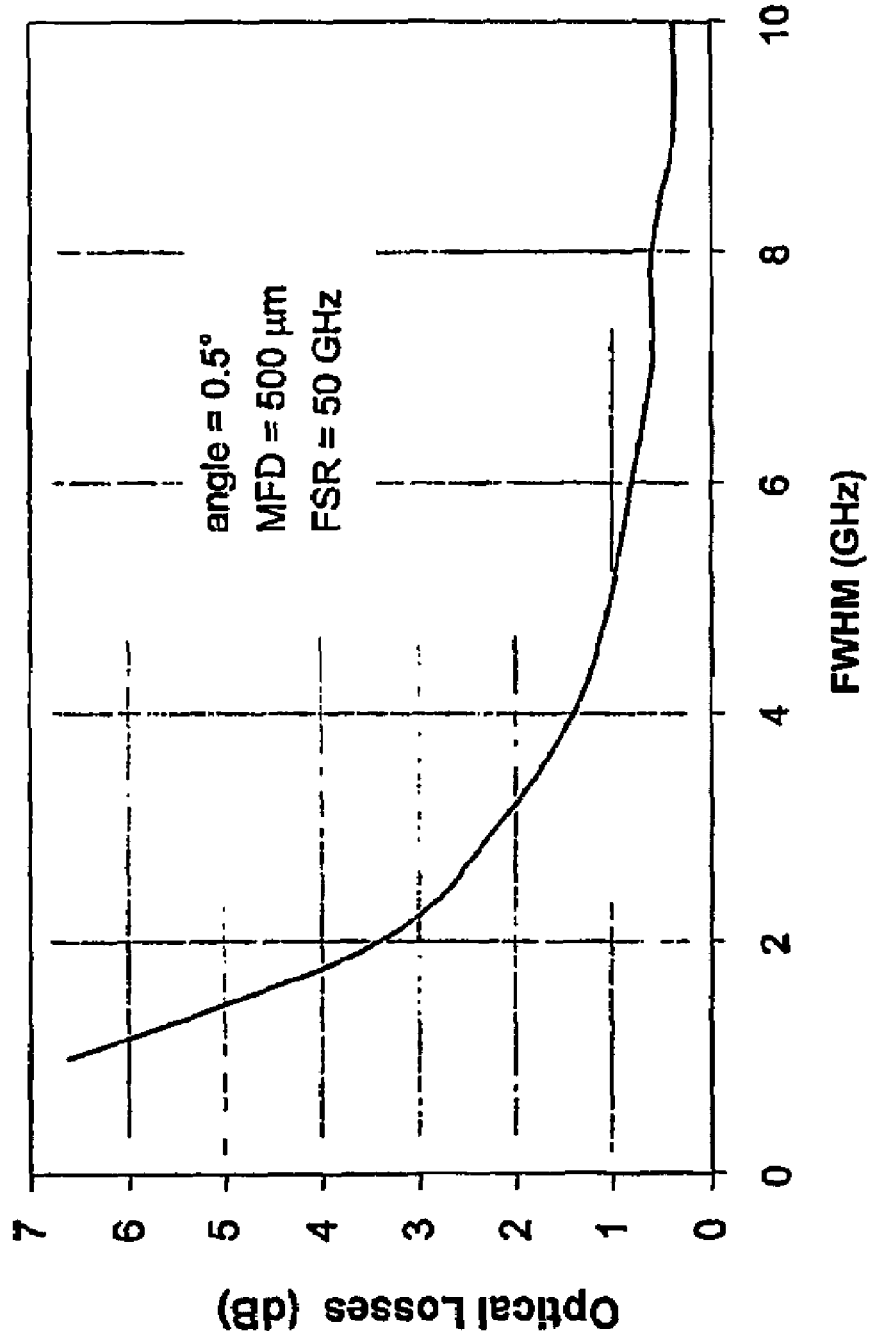
FIG. 5 is a diagram illustrating the optical losses of the laser external cavity as a function of the bandwidth at FWHM of a FP etalon having a FSR of 50 GHz and being positioned in the cavity with an inclination angle to the perpendicular to the optical beam of 0.5°.

FIG. 5 shows an increasing optical loss with a decreasing $(FWHM)_{FP}$ for a FP etalon positioned at an inclination angle of 0.5° and having $(FSR)_{FP}$=50 GHz and beam mode field diameter (MFD) of 500 μm. For $(FWHM)_{FP}$ smaller than about 3 GHz, optical losses become larger than 2 dB, while for $(FWHM)_{FP}$ of 2 GHz, optical losses are larger than 3 dB.

The $(FWHM)_{FP}$ is then preferably larger than about 2 GHz, more preferably larger than about 3 GHz.

When the condition of passive phase quasi-synchronism of the lasing frequency is fulfilled, i.e., when the $(FWHM)_{FP}$ of the etalon is properly selected, it is possible to implement a closed-loop control that makes the laser to operate at the desired wavelength that corresponds to the etalon peak (the one selected by the tuneable mirror), thus to a local maximum in the laser output power.

The closed-loop control for aligning the lasing mode with the selected etalon peak can be carried out by for example adjusting the injection current of the gain medium, e.g., the laser diode. A change in the injection current of the laser diode induces a change in the refraction index of the gain medium and thus a variation in the phase of laser output. Small adjustments of the injection current of the laser diode can then be used to maximise the output power.

Figure 6:
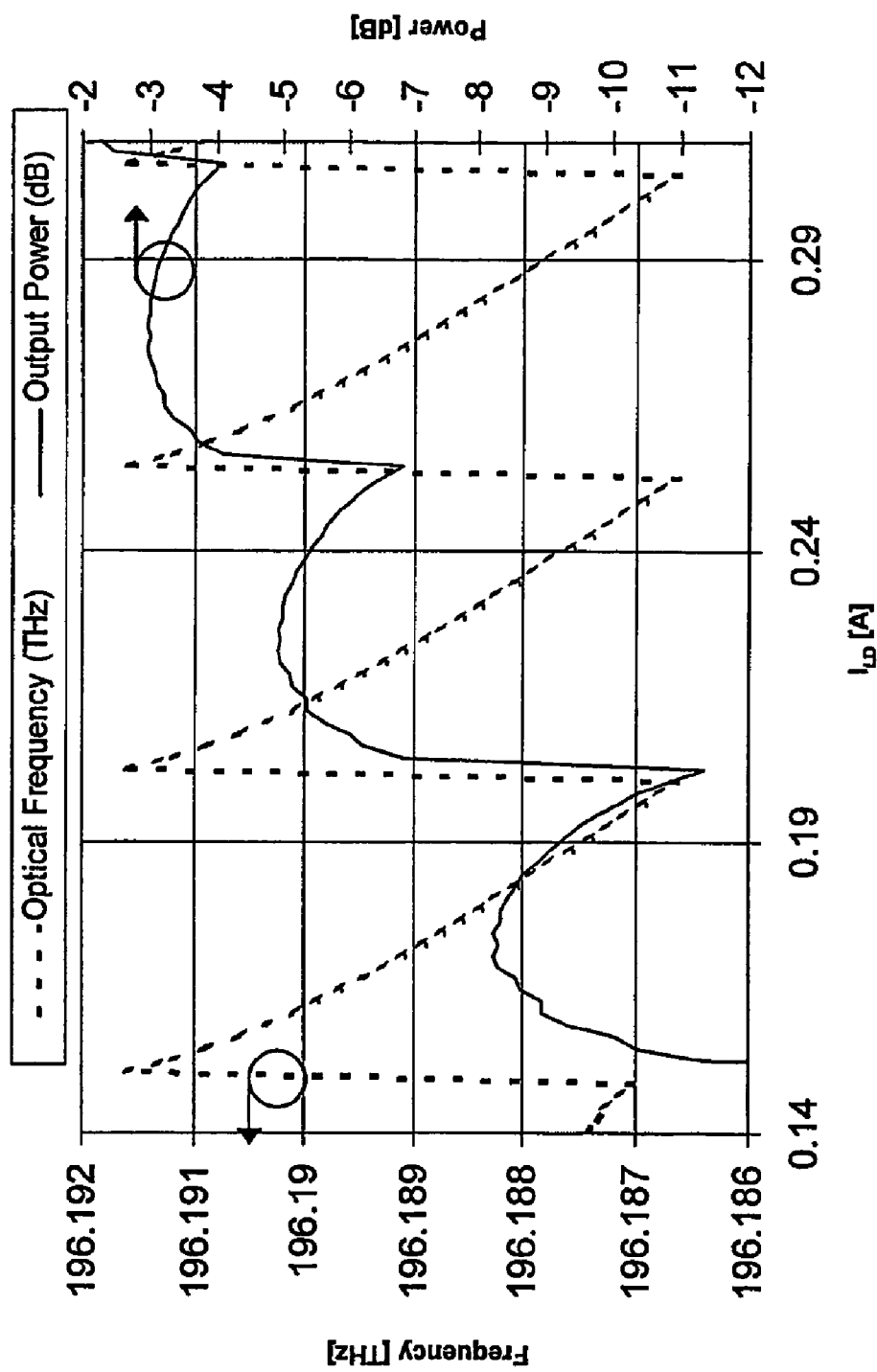
FIG. 6 is an exemplary measurement showing the laser output power (solid line) and the output optical frequency (dashed line) as a function of the injection current of the laser diode.

FIG. 6 shows the laser output power (solid line) as a function of the injection laser diode current, $I_{LD}$, for an exemplary tuneable laser according to the invention. At the local maxima of the output power alignment of the cavity mode with the (selected) etalon peak is obtained. Local minima correspond to the condition of mode hopping. FIG. 6 shows also the laser frequency dependency on $I_{LD}$ (dashed line). The difference between the maximum and the minimum frequency corresponds to the minimum distance between two adjacent cavity modes within the selected etalon peak, i.e., to $s_{min}$.

From FIG. 6 it can be seen that more than one stable operating condition for the laser can be achieved, the stable operating conditions corresponding to the peaks in the output power. The output power can be selected by varying the injection current so as to correspond to one of a series of discrete values, each power value about the local maxima being stable over time.

If the laser were to drift for some reason, e.g., caused by ageing or thermal effects, it would be sufficient to adjust only the injection current to correct the frequency, thus avoiding the occurrence of mode hopping by quickly and precisely centring the frequency.

The tuneable laser is turned on by switching on the laser diode with a certain injection current comprised in the range that guarantees single-mode operation. At any initial value of injection current within the single-mode operating range, the tuneable laser configuration allows a quick and accurate centring of the channel frequency, even considering possible current drifts due to ageing or thermal effects.

A simple algorithm that maximises the laser output power can be implemented for fine tuning of the cavity mode under the peak of the etalon mode.

The tuneable element in the laser cavity serves as the coarse tuning element that discriminates between the peaks of the FP etalon. Accuracy and control in the positioning of the tuneable element with respect to the selected channel frequency is of great importance, especially when high laser frequency accuracies are required. A control loop is therefore desirable to set and keep the peak of the tuneable element aligned with the selected cavity mode.

In the preferred embodiments, the tuneable element is a tuneable mirror. Referring back to FIG. 4(a), the structure of tuneable mirror 13 according to one of the preferred embodiments is described more in detail in U.S. Pat. No. 6,215,928. Briefly, the tuneable mirror is an electro-optical element that includes a waveguide formed onto a substrate. A diffraction grating is formed onto the waveguide, for instance of the same material of the waveguide. Over the diffraction grating a cladding layer that fills at least the interstices of the diffraction grating is formed. The cladding layer is made of a liquid crystal material having a wide range of electrically selectable indices of refraction. There may be also optionally an anti-reflection coating over the cladding layer and/or an anti-reflection coating on the surface of the substrate that is opposite to the waveguide. Two transparent conductors are placed on opposite surfaces of the liquid crystal layer. A voltage or current source is coupled across the two transparent conductors. Depending on the voltage or current across the voltage applied to the conductors, the tuneable mirror reflects radiation only at a given wavelength ($\lambda_{TM}$). Radiation at all other wavelengths passes through the tuneable mirror. Thus, in the laser configuration of the present embodiment, the tuneable mirror functions both as tuneable selector element and as cavity end mirror.

The tuneable mirror is driven with an alternating voltage $V_{TM}$ at a frequency $f_A$ [$V_{TM}(f_A)$] to prevent deterioration of the liquid crystal due to dc stress. The frequency of the applied voltage may range from 20 kHz to 200 kHz. The spectral response of the tuneable mirror is a spectral line, with a lineshape for example similar to that of a Lorentzian curve, centred at $\lambda_{TM}$, having a $(FWHM)_{TM}$ bandwidth that may range from about 50 GHz to about 250 GHz. In a particular embodiment, the $\lambda_{TM}$ can be tuned over a 80 nm range.

Preferably, impingement of the beam is substantially perpendicular to the waveguide surfaces of the tuneable mirror. An impinging beam with constant power at a wavelength $\lambda$ is reflected by the mirror when the incident wavelength $\lambda$ coincides or is close to $\lambda_{TM}$. The tuneable mirror then reflects a beam that is modulated in amplitude with frequency $f_A$ and its associated higher-order harmonics $2f_A, 3f_A, \ldots, nf_A$, because of the applied AC voltage.

Figure 7:
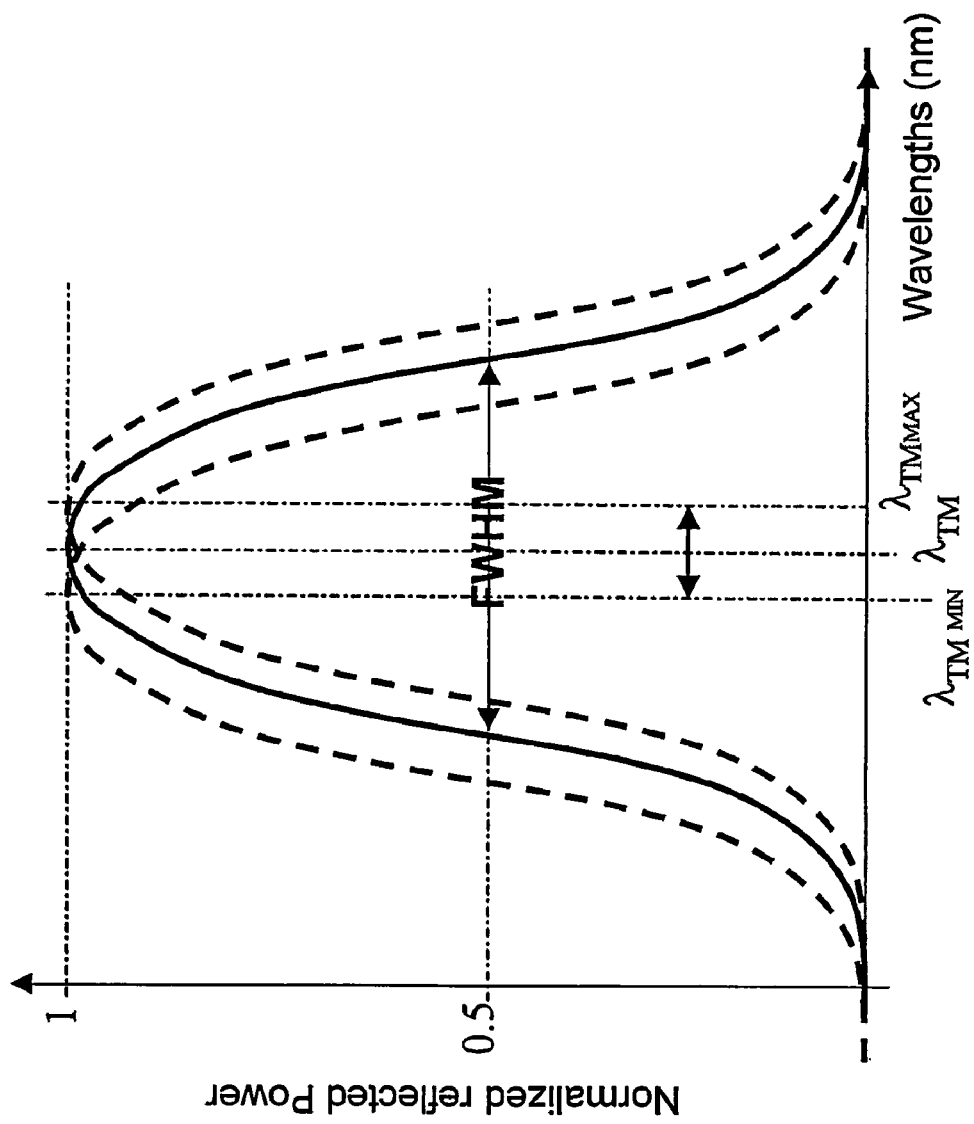
FIG. 7 is a diagram illustrating the spectral response of the tuneable mirror, which exhibits an oscillation due to the AC applied voltage.
Figure 8:
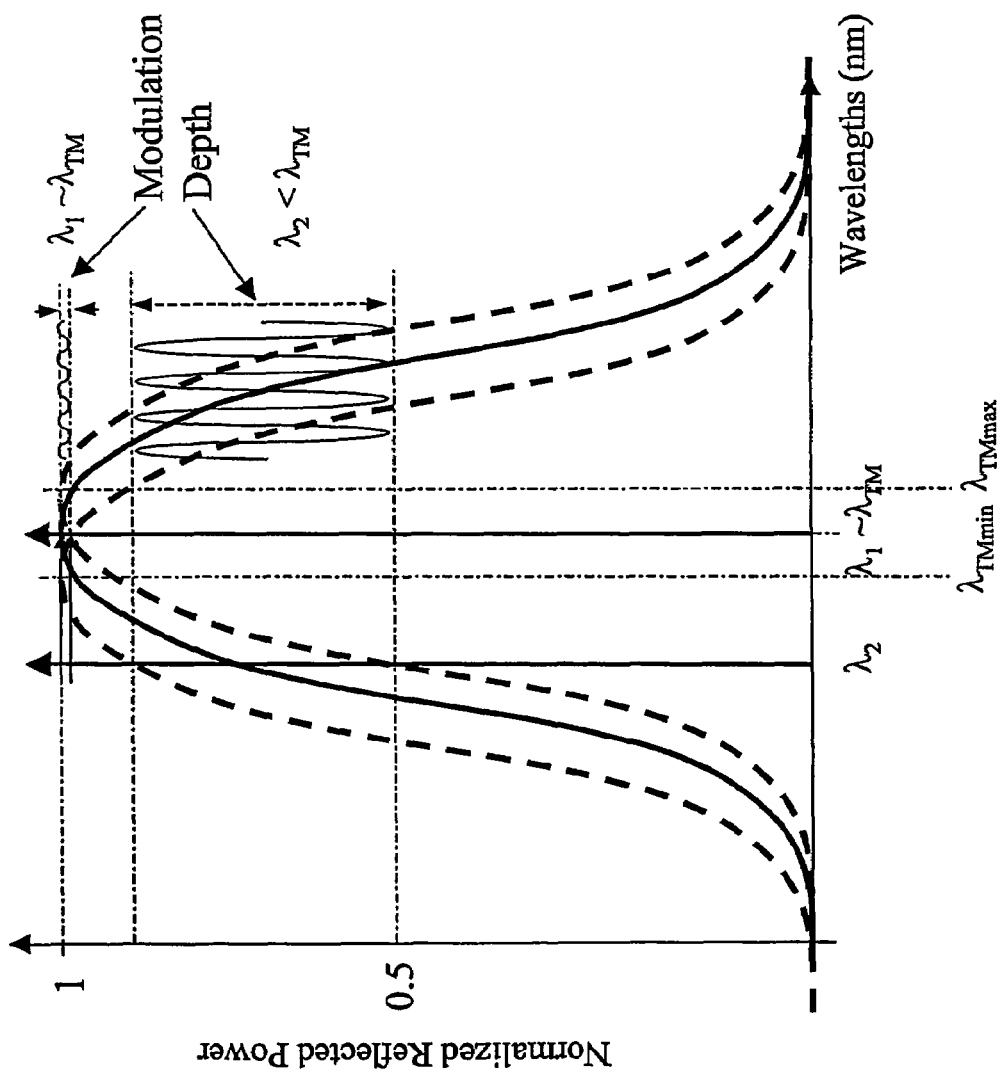
FIG. 8 is a diagram illustrating the spectral response of the tuneable mirror, showing also the dependence of modulation depth on the incident wavelength.

The AC voltage induces an oscillation of the central wavelength $\lambda_{TM}$ of the spectral response of the tuneable mirror. FIG. 7 schematically illustrates the spectral response of the tuneable mirror by plotting the normalised reflected power as a function of wavelength, by assuming that the spectral line has a Gaussian shape. The spectral line oscillates with frequency $f_A$ between a peak value of $\lambda_{TMmin}$ and of $\lambda_{TMmax}$. In FIG. 7, solid line represents the spectral line centred at $\lambda_{TM}$, whereas the dashed lines represent the spectral lines centred at $\lambda_{TMmin}$ and at $\lambda_{TMmax}$. This oscillation induces an amplitude modulation of the reflected beam, which depends on the position of the incident wavelength $\lambda$ with respect to $\lambda_{TM}$. FIG. 8 illustrates the effect of the modulation of the reflected beam for two incident beams, the first having a wavelength approximately equal to that of the tuneable mirror, i.e., $\lambda_1 \sim \lambda_{TM}$, and the second having a wavelength different from $\lambda_{TM}$, for example, $\lambda_2 < \lambda_{TM}$. For the impinging beam at $\lambda_1$, the oscillation of the spectral line induces an amplitude modulation at frequency $f_A$ (and its higher-order harmonics) in the reflected beam, the modulation having a minimum modulation depth. In contrast, the oscillation of the spectral line induces a modulation with a relatively larger modulation depth if the incident wavelength $\lambda_2$ differs substantially from $\lambda_{TM}$, the modulation depth being larger with increasing the wavelength difference, in absolute value, $\Delta\lambda = |\lambda - \lambda_{TM}|$. Consequently, it is possible to derive the wavelength difference $\Delta\lambda$ from the spectral analysis of the modulated component of the reflected beam.

Modulation depths can range from about 0.1% to about 10%, for a range of $V_{TM}$ frequencies $f_A$ between 20 and 200 kHz. Modulation depth is also a function of the voltage $V_{TM}$, the modulation being deeper with increasing voltage and ranging from 3 V to 30 V RMS.

Large modulation depths correspond to the condition of misalignment of the tuneable mirror to the incident cavity mode, whereas minimum modulation depth corresponds to the (optimal) alignment condition.

Figure 4B:
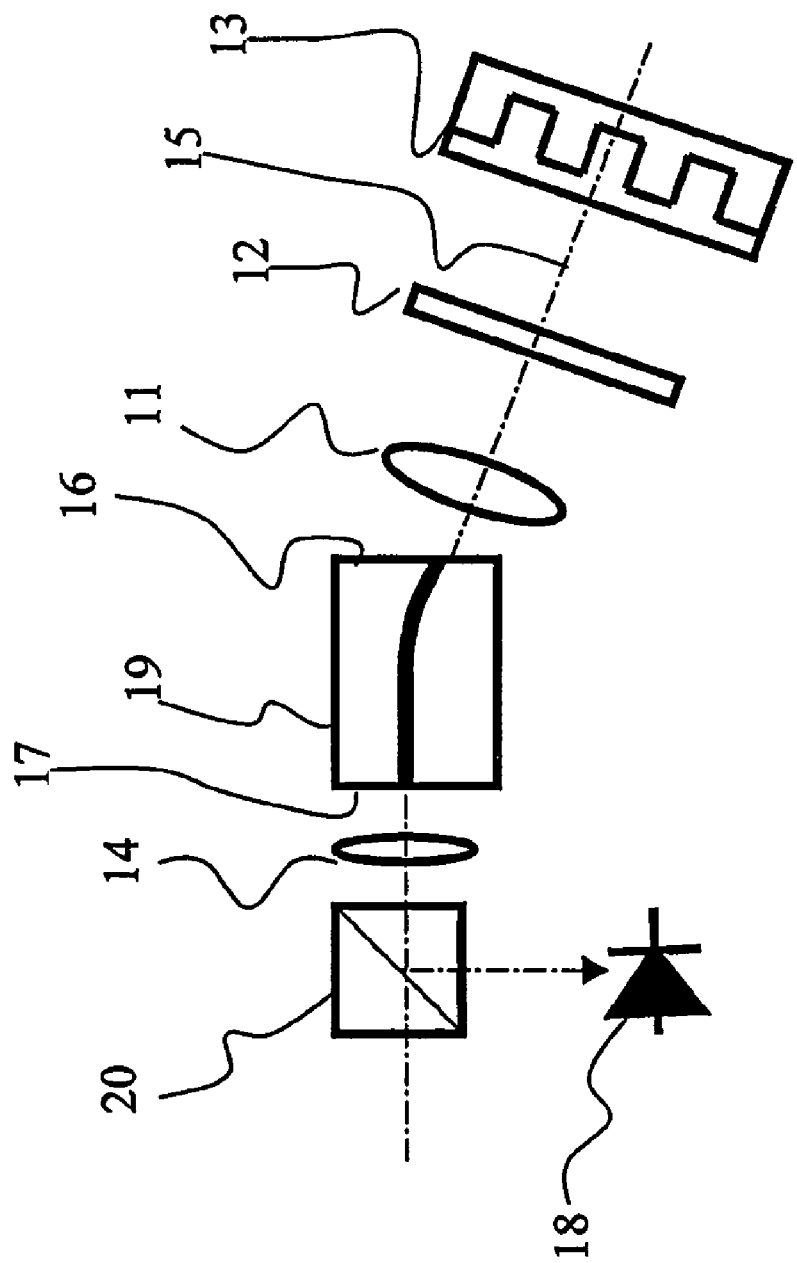
FIG. 4(b) is a schematic view of the tuneable laser assembly according to a further embodiment of the invention.

One way of deriving $\Delta\lambda$, i.e., the degree of the centring of the incident wavelength with the resonant wavelength of the tuneable mirror, is by measuring the modulated component of the power of the reflected beam. It is preferable to measure the beam power externally to the cavity to reduce the optical elements in the laser cavity, which can be source of insertion losses or introduce a phase perturbation. Referring to FIG. 4(b), the photodetector 18 can be placed in front of the gain medium 10, at the laser output. According to this embodiment, the laser output beam is detected after being splitted by means of a beam-splitter 20, e.g., a 98%/2% tap.

Alternatively, the modulated component of the power transmitted through the tuneable mirror can be measured. Referring to FIG. 4(a), the tuneable mirror 13 has a typical reflectivity of 70%-95%, allowing a (small) portion of incident light to be transmitted. Obviously, the minimum of transmittance occurs at $\lambda_{TM}$. In the laser configuration illustrated in FIG. 4(a), a photodetector 18, e.g., a photodiode, is placed externally to the cavity to measure the light transmitted through the tuneable mirror.

In both configurations illustrated in FIGS. 4(a) and 4(b), the modulated component of the externally transmitted light, e.g., the AC transmitted power [FIG. 4(a)], or the AC laser output power [FIG. 4(b)], $P_f$, can be measured by means of the photodetector followed by or integrated with an electrical spectrum analyser, e.g., an oscilloscope (not shown). For instance, a photodiode can be directly connected to the oscilloscope.

Figure 9:
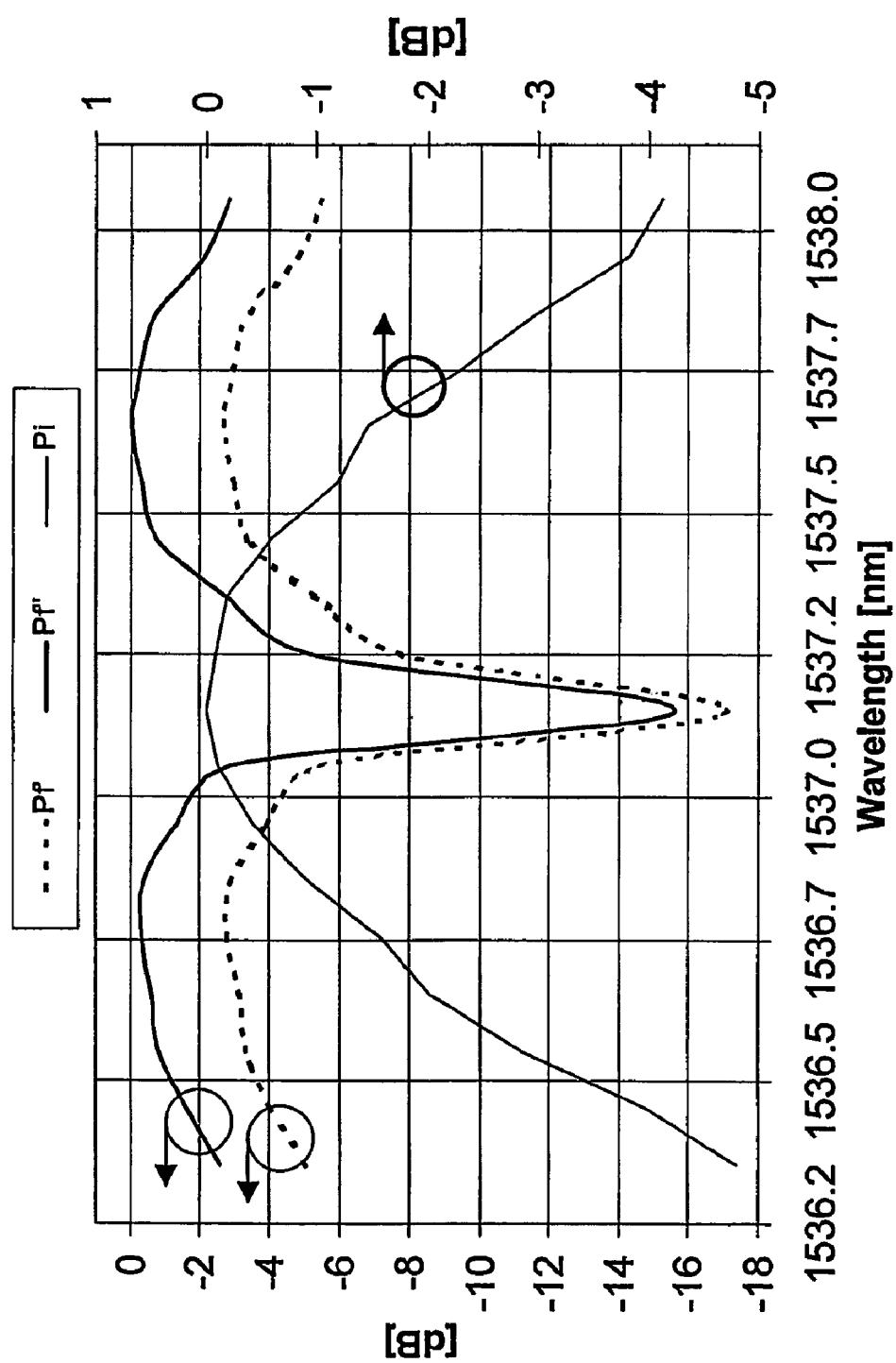
FIG. 9 is an exemplary measurement of the integrated laser output power as a function of wavelength (thin solid line) and of the AC components of the laser output power, at frequency $f_A$ (thick solid line) and at $2f_A$ (dashed line).

The transmitted or laser output power received by the photodetector 18 is a function of wavelength. Considering the configuration of FIG. 4(b), if the wavelength of the reflected beam changes there is change in the reflected power. FIG. 9 shows an exemplary measurement of the reflected power vs. wavelength. Thin solid line represents the integrated detected power $P_i$ (unmodulated), which is the spectral response of the tuneable mirror. The maximum of $P_i$ corresponds to the resonant wavelength $\lambda_{TM}$. Thick solid line represents the modulated component of the laser output power at frequency $f_A$, $P_f'$, exhibiting a sharp minimum in correspondence to the resonant wavelength. Modulated components of higher-order harmonics can be also measured. In FIG. 9, the modulated component at frequency $2f_A$, $P_f''$, is shown with a dashed line. FIG. 9 clearly shows that the modulated components of the laser output power are several orders of magnitude more sensitive to wavelength changes than the integrated power $P_i$. As both the integrated power and its modulated component depend on the input power, i.e., the power of the impinging beam, the ratio $P_i/P_f$ can be monitored for wavelength control.

The amplitude of the modulation of the beam reflected [FIG. 4(b)] or transmitted [FIG. 4(a)] by the tuneable mirror indicates the magnitude of the adjustment required for the alignment of the channel selector, i.e., the tuneable mirror, with the cavity modes. The phase of the modulation of the reflected or transmitted beam indicates the direction of the adjustment. Operatively, in the laser assembly, an AC component of the optical power at the laser output and its related phase are measured to evaluate the magnitude and the sign of the wavelength difference between the cavity mode wavelength $\lambda_{CM}$ and the peak wavelength of the tuneable mirror $\lambda_{TM}$, i.e., $\Delta\lambda = \lambda_{CM} - \lambda_{TM}$. In order to reduce or to cancel the wavelength difference $\Delta\lambda$, minimisation of the AC component of the optical power is sought by changing the voltage $V_{TM}$ applied to the tuneable mirror.

Alternatively to the spectral analysis of the modulated signal, two other methods can be used. In case of monitoring the power transmitted through the tuneable mirror, a gradient algorithm can be implemented to minimize the total power transmitted in order to align $\lambda_{TM}$ with $\lambda_{CM}$. Minimisation of the transmitted power can be obtained by changing the applied voltage $V_{TM}$ and measuring the transmitted power in a configuration of the type shown in FIG. 4(a), e.g., by implementing a control algorithm. In case of monitoring of the laser output [FIG. 4(b)], a gradient algorithm can be implemented to maximise the optical power of the laser output.

The control algorithm for the alignment of the tuneable element ensures that the modulation depth is not larger than about ±2% in the whole laser tuning range, e.g., in the C-band from 1530 to 1565 nm. In this way, broadening of the spectral linewidth of the laser output signal is not larger than about 10 MHz for emission wavelengths ranging from 1530 to 1565 nm.

The frequency of the modulation is selected low enough to avoid interference with the modulated carrier signal provided by the external cavity laser during transmission. Preferably, the modulation frequency is comprised in the range 20 kHz to 200 kHz.

With this system real-time signal monitoring can be carried out. Initial operation points for all channels on the ITU grid are stored in a look-up table. In the look-up table every channel is associated to a voltage $V_{TM}$ applied to the tuneable mirror, and thus to a selectable channel wavelength $\lambda_{TM}$.

For mode stabilisation in the laser cavity alignment of the cavity mode at $\lambda_{CM}$ with the centre of the etalon's transmission peak at $\lambda_{FP}$ should be attained. As described above, centring of the etalon peak with the cavity mode can be obtained by adjusting the injection current, $I_{LD}$, of the laser diode and monitoring the laser output power. The laser output power can be measured by means of a photodetector placed in front of the gain medium, at the laser output, as illustrated in the configuration of FIG. 4(b). The look-up table can store also the initial operative values of injection current, $I_{LD}$, which are associated to the channel frequencies.

In a preferred embodiment, monitoring of the laser output power for aligning both the tuneable mirror to the cavity mode and the cavity mode to the etalon peak, is carried out by means of a photodiode in the configuration shown in FIG. 4(b). To align the tuneable mirror to the selected cavity mode, the AC component of the output power is analysed, whereas to align the cavity mode to the etalon peak maximisation of the integrated (unmodulated) output power is sought. Two control algorithms, which operate sequentially, can be implemented to this purpose.

It is to be noted that the two control algorithms can work independently of one another, for instance, the control algorithm to align the tunable mirror to the cavity mode works also if the condition of minimum loss, i.e., phase synchronism of the cavity mode, is not fulfilled.

Figure 10:
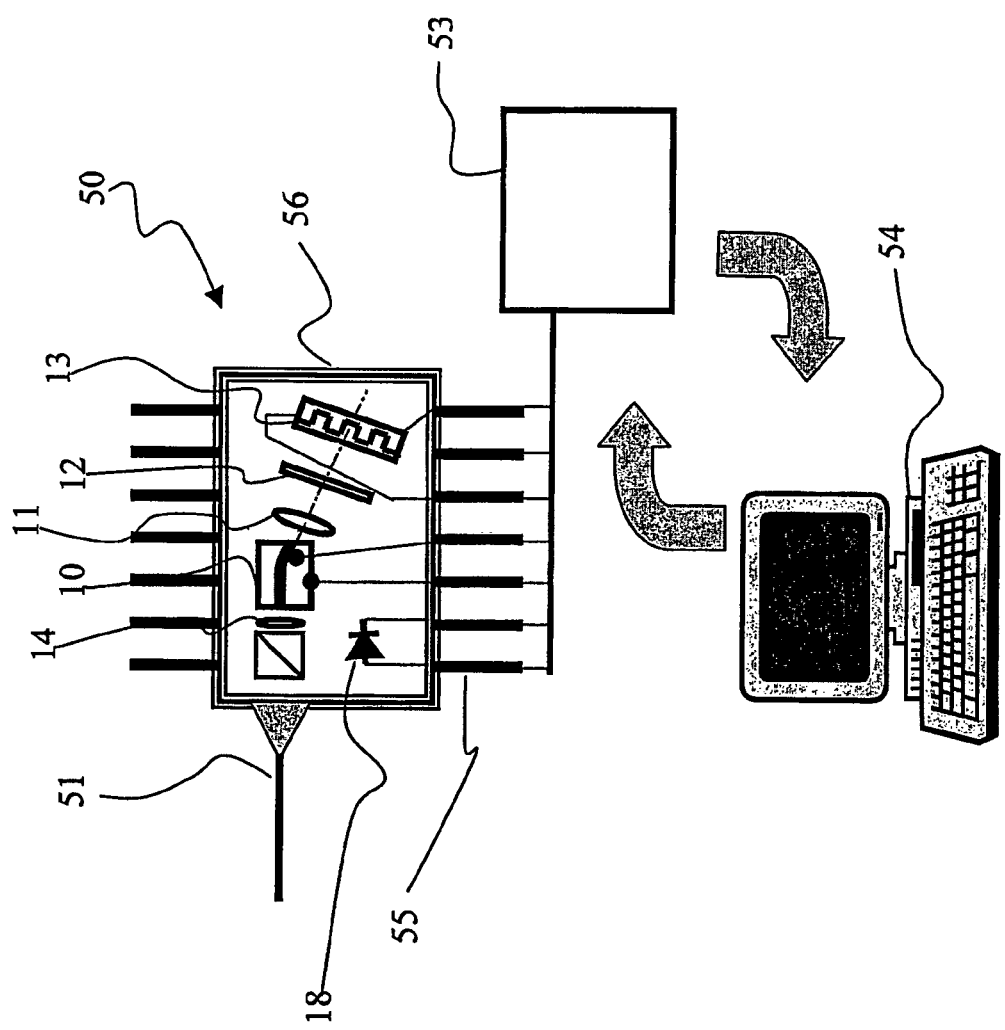
FIG. 10 is a schematic view of a control circuit for wavelength stabilisation of a tuneable laser according to an embodiment of the invention.

FIG. 10 shows a schematic set-up of a control circuit for wavelength and mode stabilisation of a laser system according to an embodiment of the present invention. The same reference numerals are given to elements of the tuneable laser corresponding to those shown in FIG. 4(b) and their detailed explanation is omitted. The laser assembly fits in a 14-pin butterfly package 56 with lead pins 55 and fibre pigtail 51. The package housing the laser assembly with the output connections, e.g., lead pins and/or fibre pigtails, forms the tuneable laser module 50. The photodetector 18 is electrically connected to a driver 53. The driver implements the control algorithms for frequency and mode control. When laser is turned on or a channel is switched, the driver reads from the look-up table the current $I_{LD}$ to be applied to the laser diode and the voltage $V_{TM}$ to be applied to tuneable mirror. Then, the driver starts to perform in sequence the closed-loop algorithm for the mode control to align the cavity mode under the selected etalon peak and the algorithm for frequency control to align the channel selector to the oscillating cavity mode. In the set-up, all currents are controlled through the driver 53 by a program running on a PC 54. The feedback information on the alignment of the tuneable mirror is provided by a real-time optical power monitoring circuit and the PC is used as the controller to adjust the tuning voltage to achieve the desired wavelength. The PC is also used as a controller to adjust the injection current of the laser diode to achieve the condition of phase synchronism. It is to be understood that a feedback circuit implemented on a chip card can be used to control all parameters, instead of using a PC.

Preferably, the tuneable laser module is stabilised in temperature in order to minimise drifting in the optical cavity length and/or to stabilise the phase of the laser cavity. With reference to FIG. 10, the gain medium 10 and the front lens 14 can be mounted on a thermo-electric cooler (TEC) (not shown) having a temperature stability of about 0.2° C.

Temperature control can also allow fine adjustments for frequency stabilisation. In this case, a look-up table can be created before laser operation, in which each channel of the ITU grid is associated both to the injection current of the laser diode and to a temperature $T_1$ of the TEC, i.e., of the gain medium. Slight changes in $T_1$ correspond to small changes to the phase of the laser cavity that can thus be adjusted for a fine tuning of wavelength of the cavity mode with the selected wavelength peak of the Fabry-Perot etalon, i.e., $\lambda_{CM} \sim \lambda_{FP}$. A behaviour similar to that shown in FIG. 6 can be found between output power and the laser diode temperature. However, the method of changing the current $I_{LD}$ for cavity mode alignment is preferred because of the ramp rates in temperature variations, which makes the laser response to the instability generally slower.

Preferably, the FP etalon is placed on a TEC having a temperature stability of about 0.2° C. Temperature stability of the FP etalon is important in order to lock the etalon peaks to the ITU fringes. Typically, for the commercially available FP etalons, peak frequency temperature sensitivity for alignment to the ITU grid is around 1.3 GHz/° C. The temperature can be set during the initial characterization of the laser system. The tuneable mirror can be placed on the TEC with the FP etalon. Temperature stabilisation of the tuneable mirror is especially desirable in case of tuneable mirrors including an LC, as the properties of the LC may change due to thermal fluctuations.

Alternatively, the gain chip, the FP etalon and optionally the tuneable mirror can be placed on the same TEC. Obviously, no phase tuning of the laser cavity by adjusting the temperature is possible. The use of a single TEC can be advantageous in terms of package cost and of a simplified temperature control.

The invention claimed is:

1. A tunable laser system configured to emit output radiation on a single longitudinal mode at a laser emission frequency, comprising:
   an external cavity having a physical length and a plurality of cavity modes;
   a gain medium to emit an optical beam into the external cavity;
   a channel allocation grid element being arranged in the external cavity to define a plurality of periodic pass bands substantially aligned with corresponding channels of a selected wavelength grid, each of the pass bands having a bandwidth at full-width half maximum (FWHM); and
   a tunable element arranged in the external cavity to tuneably select one of the pass bands so as to select a channel to which to tune the optical beam,
   wherein said physical length of the external cavity is not larger than 15 mm and the bandwidth FWHM of the channel allocation grid element is 2 to 8 GHz.

2. The laser system according to claim 1, wherein the bandwidth of the channel allocation grid element at FWHM is 3 to 6 GHz.

3. The laser system according to claim 1, wherein the physical length is not larger than 12 mm.

4. The laser system according to claim 1, wherein the laser emission frequency is selected on a single cavity mode within a given frequency accuracy which is not smaller than 0.5 GHz and the bandwidth of the channel allocation grid element at FWHM is selected so that the minimum distance between two adjacent cavity modes of the external cavity within the pass bands of the channel allocation grid element is not larger than twice the frequency accuracy.

5. The laser system according to claim 1, wherein the selected wavelength grid has a channel spacing of 25 to 200 GHz.

6. The laser system according to claim 1, wherein the selected wavelength grid has a channel spacing of 25 or 50 GHz.

7. The laser system according to claim 1, wherein the channel allocation grid element comprises a Fabry-Perot etalon.

8. The laser system according to claim 7, wherein the Fabry-Perot etalon is placed at an inclination angle of 0.4° to 0.8° to the perpendicular of the optical beam.

9. The laser system according to claim 7, wherein the Fabry-Perot etalon is placed at an inclination angle of 0.5° to the perpendicular of the optical beam.

10. The laser system according to claim 1, wherein the tunable element has a bandwidth at FWHM of 50 to 250 GHz.

11. The laser system according to claim 10, wherein the tunable element has a bandwidth at FWHM of 50 to 100 GHz.

12. The laser system according to claim 1, wherein the tunable element comprises a tunable mirror placed at one end of the external cavity.

13. The laser system according to claim 12, wherein the tunable mirror is an electro-optical element that comprises a waveguide formed onto a substrate and a diffraction grating formed onto the waveguide.

14. The laser system according to claim 13, wherein the tunable mirror further comprises a cladding layer that fills at least the interstices of the diffraction grating, said cladding layer comprising a liquid crystal material.

15. The laser system according to claim 1, wherein the gain medium is a semiconductor laser diode.

16. The laser system according to claim 1, wherein the laser emission frequency is selected on a single transversal cavity mode.

17. A method for controlling a laser emission frequency of a tunable laser system having an external cavity defining a plurality of cavity modes spaced from each other by $(FSR)_{cavity}$, wherein the physical length of the external cavity is not larger than 15 mm, the laser emission frequency being selected on a single longitudinal cavity mode, comprising the steps of:

tuning an optical beam emitted from a gain medium to a corresponding centre frequency of a pass band selected from a plurality of periodic pass bands substantially aligned with corresponding channels of a selected wavelength grid element; and selecting the bandwidth at FWHM of the selected pass band so that 2 GHz $\leq$ FWHM $\leq$ 8 GHz, and selecting the $(FSR)_{cavity}$ to be larger than about 8 GHz.

18. The method according to claim 17, wherein the bandwidth at FWHM of the selected pass band is 3 to 6 GHz.

19. The method according to claim 17, wherein the channels of the selected wavelength grid element have a channel spacing of 25 to 100 GHz.

20. The method according to claim 19, wherein the bandwidth at FWHM of the selected pass band and $s_{min}$ satisfy the following relationship:

$$FWHM = \alpha + \beta \cdot s_{min}$$

where $\alpha$ is $-0.8$ to $-2.7$ GHz and $\beta$ is 1.2 to 2.6.

21. The method according to claim 17, further comprising the step of aligning the laser emission frequency with the selected pass band by adjusting the injection current of the gain medium so as to maximise the laser output power.

22. A method for controlling a laser emission frequency of a tunable laser system having an external cavity defining a plurality of cavity modes spaced from each other by $(FSR)_{cavity}$, wherein the physical length of the external cavity is not larger than 15 mm, the laser emission frequency being selected on a single longitudinal cavity mode within a given frequency accuracy, comprising the steps of:

tuning an optical beam emitted from a gain medium to a corresponding centre frequency of a pass band selected from a plurality of pass bands substantially aligned with corresponding channels of a selected wavelength grid element;

selecting the $(FSR)_{cavity}$ to be larger than about 8 GHz; and selecting the bandwidth at FWHM of the selected pass band to be comprised between about 2 GHz and about 8 GHz so as to introduce cavity mode compression in correspondence to the selected pass band and so as to cause the minimum distance between two adjacent cavity modes of the external cavity within the pass band, $s_{min}$, to be not larger than twice the frequency accuracy.

23. The method according to claim 22, wherein the frequency accuracy is not smaller than 0.5 GHz.

* * * * *

UNITED STATES PATENT AND TRADEMARK OFFICE
CERTIFICATE OF CORRECTION

PATENT NO. : 7,505,490 B2  
APPLICATION NO. : 10/573892  
DATED : March 17, 2009  
INVENTOR(S) : Romano et al.

Page 1 of 1

It is certified that error appears in the above-identified patent and that said Letters Patent is hereby corrected as shown below:

On Title page, item (73), line 1, "Phontonics" should read --Photonics--.

On Title page, item (57), lines 18-19, "(FWHM) $_{FP}$" should read --(FWHM)$_{FP}$--.

Signed and Sealed this

Ninth Day of June, 2009

JOHN DOLL  
*Acting Director of the United States Patent and Trademark Office*